United States Patent [19]

Kubota et al.

[11] Patent Number: 5,638,168
[45] Date of Patent: Jun. 10, 1997

[54] LENS EVALUATING DEVICE

[75] Inventors: Shigeo Kubota; Michio Oka, both of Kanagawa, Japan

[73] Assignee: Sony Corporation, Tokyo, Japan

[21] Appl. No.: 313,387

[22] Filed: Sep. 27, 1994

[30] Foreign Application Priority Data

Sep. 29, 1993 [JP] Japan .................................. 5-243094

[51] Int. Cl.$^6$ ................................................ G01M 11/00
[52] U.S. Cl. .......................................................... 356/124.5
[58] Field of Search ................................. 356/125, 124, 356/124.5, 126, 127; 355/53

[56] References Cited

U.S. PATENT DOCUMENTS

| | | | |
|---|---|---|---|
| 3,447,874 | 6/1969 | Back | 356/124.5 |
| 3,519,358 | 7/1970 | Kuttner et al. | 356/124.5 |
| 4,060,328 | 11/1977 | Flynt | 356/124.5 |
| 4,772,120 | 9/1988 | Pointeau | 356/124.5 |
| 5,321,493 | 6/1994 | Kamon | 356/124 |

*Primary Examiner*—Hoa Q. Pham
*Attorney, Agent, or Firm*—Hill, Steadman & Simpson

[57] ABSTRACT

A lens evaluating device for measuring the optical transfer function of the lens under evaluation for evaluating the lens. The lens evaluating device includes an exposure light source, a converging lens for converging a light beam radiated from the exposure light source at a point, a characteristics evaluating pattern onto which the light beam outputted from the converging lens is converged by the lens under evaluation to form an image on it, a detection unit for receiving a return light beam having scanned the characteristics evaluating pattern via the lens under evaluation for detecting changes in reflection intensity of the return light beam, and an analysis unit for executing frequency analysis of the detected results from the detection unit for measuring the optical transfer function. The results of detection by the detection unit are subjected to a frequency analysis using a spectrum analyzer for measuring the optical transfer function of the lens under evaluation for evaluating the lens. An exposure light source includes a first resonator and a second resonator. The first resonator has a laser medium illuminated by an excited light radiated by an exciting light source and a first non-linear optical crystal device for wavelength-converting the light beam radiated from the laser medium. The second resonator has a second non-linear optical crystal device for wavelength-converting a light beam radiated from the first resonator.

3 Claims, 5 Drawing Sheets

LENS EVALUATING DEVICE

BACKGROUND OF THE INVENTION

1. Field of the Invention

This invention relates to a lens evaluation device and, more particularly, to a device for measuring the optical transfer function (OTF) of the lens for evaluating lens characteristics.

2. Description of the Related Art

A semiconductor exposure device has hitherto been employed for formation of a circuit pattern of a semiconductor device. With such semiconductor exposure device, a reticle on which a circuit pattern for an original picture corresponding to the circuit pattern to be formed on the semiconductor device is formed is illuminated by a light beam radiated from an exposure light source. An image of the circuit pattern of the original picture obtained by illuminating the reticle with the light beam is formed via a projecting lens on a semiconductor wafer (semiconductor device) for exposing the circuit pattern corresponding to the image of the circuit pattern of the original picture on a resist layer formed on the semiconductor wafer.

FIG. 1 shows an arrangement of this type of a conventional semiconductor exposure device.

Referring to FIG. 1, the semiconductor exposure device includes an exposure light source 131 for radiating a light beam for illuminating a reticle 133 on which is formed a circuit pattern for an original picture corresponding to a circuit pattern to be formed on the semiconductor device. As the exposure light source 131, an excimer laser or an ultra-high pressure mercury arc lamp radiating the light of a shorter wavelength is employed. The light beam emanated from the exposure light source 131 is incident on an illuminating optical system 132 by means of which it is radiated to the reticle 133 on which there is formed the circuit pattern of the original picture corresponding to the circuit pattern formed on the semiconductor device. The image of the circuit pattern of the original picture is contracted in size to, for example, a one-fifth size, by a contracting projecting lens 113, so as to be projected on a resist layer formed on a semiconductor wafer 114, so that light exposure is made on the resist layer to a shape corresponding to the image of the circuit pattern of the original picture.

The semiconductor wafer 114 is set on an XY stage 115. The XY stage 115 is moved along two mutually perpendicular axes for variably adjusting the position of the semiconductor wafer 114 set thereon for achieving relative position setting (registration) between the reticle 133 and the semiconductor wafer 114 in order to get the image of the circuit pattern of the original picture on the reticle 133 correctly formed at a pre-set position on the semiconductor wafer 114. Such relative position setting between the reticle 133 and the semiconductor wafer 114 is achieved by detecting position setting marks formed on the semiconductor wafer 114 and moving the XY table 115 in a controlled manner responsive to the detection output.

For producing a fine circuit pattern of the semiconductor device to high accuracy, it is necessary for the image of the circuit pattern of the original picture formed on the reticle to be formed with high resolution on the semiconductor wafer. For forming the image of the circuit pattern of the original picture with high resolution and exposing the resist layer on the semiconductor wafer to light, it is necessary to employ not only a light source capable of radiating a light beam of an extremely short wavelength as a light source for exposure, but also a lens having extremely high resolution characteristics as a lens forming the image of the circuit pattern of the original picture on the semiconductor wafer.

Thus the image-forming lens employed in the semiconductor exposure device has to be evaluated as to whether or not it is capable of forming an image of an extremely fine circuit pattern having a linewidth on the order of 0.25 μm with high accuracy on the resist layer of the semiconductor wafer. If the image-forming lens employed in the semiconductor exposure device is not capable of forming the image of the fine circuit pattern on the semiconductor wafer with high accuracy, or if lens characteristics are deteriorated through the use of the semiconductor exposure device, it becomes necessary to exchange the lens with a lens having satisfactory characteristics.

The method for evaluating the characteristics, such as resolution, of a lens employed for forming the image of the circuit pattern of the original picture on the semiconductor wafer, employs a semiconductor exposure device constructed as shown in FIG. 1, in which a reticle having lines and spaces formed thereon as the reference of resolution is illuminated by a light beam outgoing from an exposure light source. An illuminated image of the line and spaces, thus formed on the reticle, is formed on the resist layer on the semiconductor wafer set on the XY stage via an image-forming lens which is to be evaluated. This resist layer is exposed and the exposed portion is developed. The cross-sectional shape of the pattern on the semiconductor wafer thus developed is measured using a scanning electron microscope. The exposure light volume distribution is calculated from the measured values of the cross-sectional shape and sensitivity characteristics of the resist layer on the semiconductor wafer. The optical transfer function of the image-forming lens is calculated form the calculated values of the exposure light volume distribution.

The above-described method is described in "Technology of Semiconductor Lithography" by Koichiro Otori, published by SANGYO TOSHO Company, page 93.

The reason the above-described method is employed in evaluating optical characteristics of the image-forming lens employed in the semiconductor exposure device is that the light beam radiated from the exposure,light source employed in the semiconductor exposure device is low in coherence and it is extremely difficult for such light beam to be converged to form a point light source for evaluating lens characteristics.

With the above-described method, consisting in developing an image of line and spaces formed on the reticle as the resolution reference on the resist layer on the semiconductor wafer, and evaluating lens characteristics from the developed picture, a series of measurement processes including a series of light exposure processes employing the semiconductor exposure device become complex. On the other hand, the operation of calculating the characteristics of the lens under measurement is a time-consuming operation, such that the lens characteristics cannot be known promptly.

In addition, the process for producing the light exposure volume distribution using sensitivity characteristics of the photoresist formed on the semiconductor wafer is susceptible to errors.

Furthermore, with the conventional semiconductor exposure device, since it is difficult to achieve highly accurate relative position setting between the reticle having lines and spaces as resolution reference formed thereon and the semiconductor wafer on which the image of these lens and spaces is to be formed, the image of the lines and spaces cannot be formed with high accuracy on the resist layer on the semiconductor wafer, as a result of which the characteristics of the lens under measurement cannot be obtained correctly.

OBJECTS AND SUMMARY OF THE INVENTION

It is an object of the present invention to provide a device for evaluating lens characteristics whereby the characteristics of the lens under evaluation can be evaluated promptly and in an error-free manner.

It is another object of the present invention to provide a device for evaluating lens characteristics whereby the characteristics of the lens under evaluation can be directly evaluated without developing the lines and spaces as the resolution reference, such that evaluation of the lens characteristics may be made without being unaffected by measurement errors other than errors proper to the lens under evaluation.

The lens evaluating device according to the present invention includes an exposure light source, a converging lens for converging a light beam radiated from the exposure light source at a point, a characteristics evaluating pattern onto which the light beam outputted from the converging lens is converged by the lens under evaluation to form an image on it, a detection unit for receiving a return light beam having scanned the characteristics evaluating pattern by the lens under evaluation for detecting changes in reflection intensity of the return light beam, and an analysis unit for performing frequency analysis of the detected results from the detection unit for measuring the optical transfer function. The results of detection by the detection unit are subjected to a frequency analysis using a spectrum analyzer for measuring the optical transfer function of the lens under evaluation for evaluating the lens.

With the lens evaluating device of the present invention, a splitting optical device is arranged between the converging lens and the lens under evaluation for splitting the light beam outgoing from the converging lens from the return light beam through the lens under evaluation.

An exposure light source includes a first resonator and a second resonator. The first resonator has a laser medium illuminated by an excited light radiated by an exciting light source and a first non-linear optical crystal device for wavelength-converting the light beam radiated from the laser medium. The second resonator has a second non-linear optical crystal device for wavelength-converting a light beam radiated from the first resonator.

The evaluation pattern is formed on a photoresist surface of a semiconductor wafer.

The lens evaluating device according to the present invention also includes a detection light source, a converging lens for converging a light beam radiated from the detection light source at a point, a characteristics evaluating pattern onto which the light beam outputted from the converging lens and converged at a point so as to be again diverged forms an image after being converged by a lens under evaluation arranged on the optical axis of the converging lens, movement means for moving the characteristics evaluating pattern relative to the converging lens within a plane perpendicular to the optical axis of the converging lens, a detection unit for receiving a return light beam having scanned the characteristics evaluating pattern moved by the movement means for detecting changes in reflection intensity of the return light beam, and an analysis unit supplied with a detection signal from the detection unit in order to perform frequency analysis on the detection signal and thereby to measure the optical transfer function.

With the lens evaluating device, a splitting optical device is arranged between the converging lens and the lens under evaluation for splitting the light beam outgoing from the converging lens from the return light beam through the lens under evaluation and for deflecting the return beam from the optical axis of a light beam outgoing from the converging lens.

The detection light source includes a first resonator and a second resonator. The first resonator has a laser medium illuminated by an excited light radiated by an exciting light source and a first non-linear optical crystal device for wavelength-converting the light beam radiated from the laser medium. The second resonator has a second non-linear optical crystal device for wavelength-converting a light beam radiated from the first resonator.

The lens evaluating device also includes a light source unit for generating fourth harmonics of the basic wave of a solid state laser, a lens for collecting and converging a laser light from the light source means to a point light source, a characteristics evaluating pattern formed on a photoresist surface of a semiconductor wafer, movement means for moving the characteristics evaluating pattern on the semiconductor wafer relative to the converging lens, detection means for detecting changes in intensity of the light reflected via a lens under evaluation from the photoresist surface having the characteristics evaluating pattern formed thereon. The characteristics evaluating pattern is scanned by the operation of the movement means. Analysis means is also provided for performing frequency analysis on the detected results from the detection means for measuring the optical transfer function. The fourth harmonics outgoing from the light source means are transmitted through the lens under evaluation so as to form an image on the characteristics evaluating pattern formed on the photoresist surface of the semiconductor wafer for evaluating the lens under evaluation.

Other objects and advantages of the present invention will become apparent from the following description of the preferred embodiments and the claims.

DESCRIPTION OF THE PREFERRED EMBODIMENTS

The device for evaluating lens characteristics according to the present invention evaluates the lens characteristics by transmitting a light beam from an exposure light source through the lens under evaluation to form an image on a pattern employed for evaluating lens characteristics, and is used for evaluating the characteristics of a lens employed for a semiconductor exposure device.

With the semiconductor exposure device employing a lens evaluated by the device of the present invention, a light beam radiated from the exposure light source is radiated onto a reticle, on which is previously formed a circuit pattern of the original picture having a five-fold size of a corresponding circuit pattern to be formed on the semiconductor device, in accordance with the photolithographic technique in general. An image of the circuit pattern of the original picture, obtained by illuminating the light beam on the reticle, is projected to and formed on the semiconductor wafer constituting the semiconductor device to a size equal to one-fifth of that of the image on the reticle via a projecting lens for exposing the circuit pattern corresponding to the circuit pattern of the original picture on the resist layer provided on the semiconductor wafer.

Figure 2:
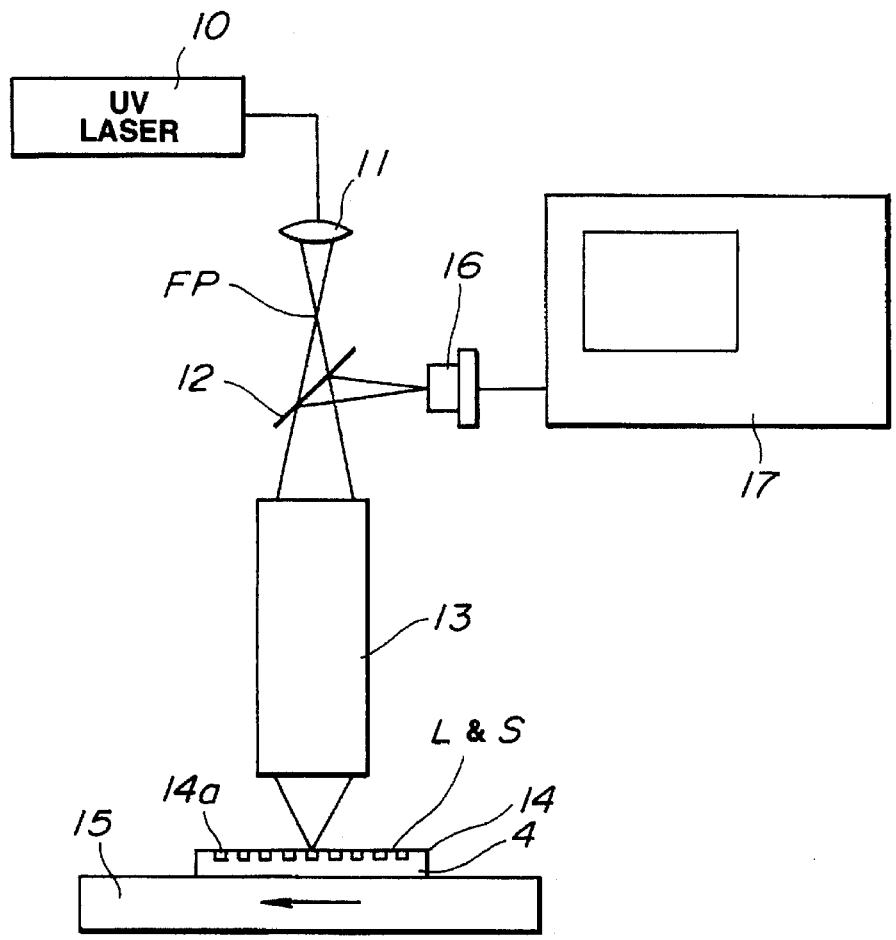
FIG. 2 is a block diagram showing a schematic arrangement of a device for evaluating lens characteristics according to an embodiment of the present invention.

Referring to FIG. 2, the device for evaluating lens characteristics includes a converging lens 11 for converging a light beam outgoing from an exposure light source 10 to a point light source, and an XY stage 15 for causing relative movement of the above-mentioned evaluation pattern with respect to the lens. The evaluating device also includes a photodetector 16 for detecting changes in intensity of the reflected light from a wafer 14 via a small-sized projecting lens 13 under measurement. The wafer 14 represents a surface on which is formed the above-mentioned evaluation pattern which is scanned as the XY stage 15 is moved. The evaluating device additionally includes a spectrum analyzer 17 for measuring the optical transfer function based upon frequency analyses of the detected results of the photodetector 16.

The exposure light source 10 wavelength-converts the laser light emitted by diode laser excitation in a first resonator. The exposure light source also wavelength-converts the outgoing light from the first resonator in a second resonator of the external resonator type and radiates a light beam wavelength-converted to fourth harmonics with respect to the basic wave. A UV laser light source is employed as the exposure light source 10. The concrete construction of the exposure light source 10 will be explained subsequently.

The outgoing light beam of the exposure light source 10, having the wavelength of the fourth harmonics, is of a narrow band of 266 nm in wavelength, and is of characteristics having high oscillation mode uniformity.

The Nd:YAG laser light beam, for example, of the fourth harmonics, radiated from the UV laser light source constituting the exposure light source 10, is converged by the converging lens 11 to form a point light source FP at a focal point of the converging lens 11. The light beam of the fourth harmonics is highly coherent and has a coherence length of tens of kms. Besides, it is oscillated with a single transverse mode. Thus the light beam assures an ideal point light source.

The light from the point light source FP is illuminated via a half mirror 12 on the contracting, projector lens 13 under evaluation. An image of the light transmitted through the contracting projector lens 13 is formed on the semiconductor wafer 14 to form a spot.

Figure 3:
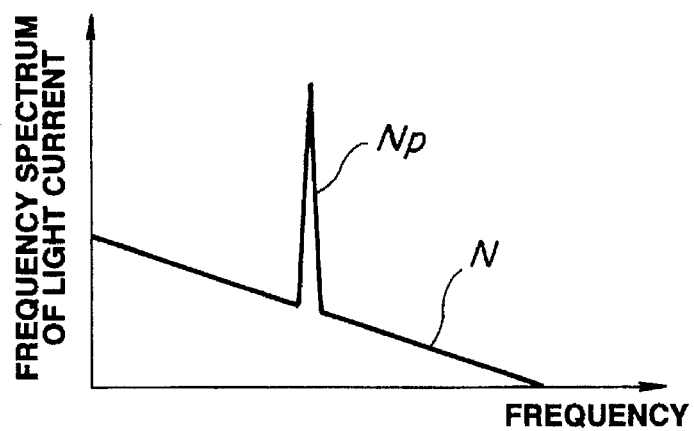
FIG. 3 is a graph showing typical results of frequency analyses by a spectrum analyzer employed in the evaluating device according to the present invention.

On the photoresist layer 14 on the semiconductor wafer 4 illuminated via the contracting projector lens 13, there is previously formed a test pattern comprised of lines and spaces. The surface of the photoresist layer 14 necessarily presents irregularities 14a, as shown in FIG. 2. The light flux scattered by these irregularities 14a, that is the reflected light from the photoresist layer 14, is transmitted through the projector lens 13 and thence supplied to the half mirror 12, whereby it is reflected at 90° so as to be supplied to the photodetector 16. Since the photoresist layer 14 is moved relative to the projector lens 13, as the XY stage is moved, it is scanned by the light spot of the illuminating light. In the photodetector 16, there is produced an irregular noise in current changes brought about by light detection of the test pattern being moved. The current proportional to the detected light enters the spectrum analyzer 17. The spectrum analyzer 17 is a frequency analysis device for executing the frequency analysis based upon the input current. The results of the frequency analysis by the spectrum analyzer 17 are shown in FIG. 3 in which the frequency and the frequency spectrum of the light current are plotted on the ordinate and on the abscissa, respectively. In the analysis pattern of FIG. 2, a spectrum peak $N_p$ in FIG. 3 is represented in terms of the spatial frequency of the lines and spaces of the test pattern and the frequency determined by the speed of movement of the wafer 14. The spectrum of broad distribution, which is decayed with increase in frequency, that is at higher frequencies, is the irregular noise N attributable to surface roughnesses of the photoresist layer 14 on which the test pattern is formed. This irregular noise N, which inherently is close to the white noise, presents the spectrum of broad distribution decayed at higher frequencies because the light beam transmitted through the contracting projector lens 13 under evaluation is acted upon by the optical transfer function (OTF) as later described. Such spectrum affords the correct OTF for the lens.

On the other hand, the relative noise intensity, that is the power spectral intensity of the above-described irregular noise divided by the mean photodetector current, integrated over the entire frequency range, is equivalent to the mean square value of the irregular noise attributable to surface roughness of the photoresist 14. By utilizing such relation, the irregular noise may be frequency analyzed for quantitatively evaluating the surface roughnesses of the photoresist 14.

The reason such analysis becomes possible is that, while the surface irregularities of the photoresist layer are jagged and present uniform frequency components, the irregularities having high frequency components scatter the light beam at a larger angle, and the light beam scattered at larger angles cannot pass through the converging lens, and hence the scattered light transmitted through the converging lens are of frequency characteristics identified with the transfer characteristics of the lens.

The OTF of the lens under inspection may be measured by evaluating the noise by taking advantage of surface irregularities of the photoresist surface.

On the other hand, the OTF of the projector lens 13 on its optical axis may be measured by placing the point light source FP on an extension of the optical axis of the projector lens 14 under inspection. The off-axis OTF of the projector lens 14 may be measured by placing the point light source FP at an offset position from the optical axis of the projector lens 14. Thus the converging lens 11 is adapted for being moved in a direction perpendicular to the optical axis for coping with the necessity for measuring the off-axis OTF.

Meanwhile, the green leakage light of the second harmonics, radiated from the first resonator having the optical axis common to the optical axis of generation of the fourth harmonics, may be utilized for setting the wafer position as described above.

Figure 1:
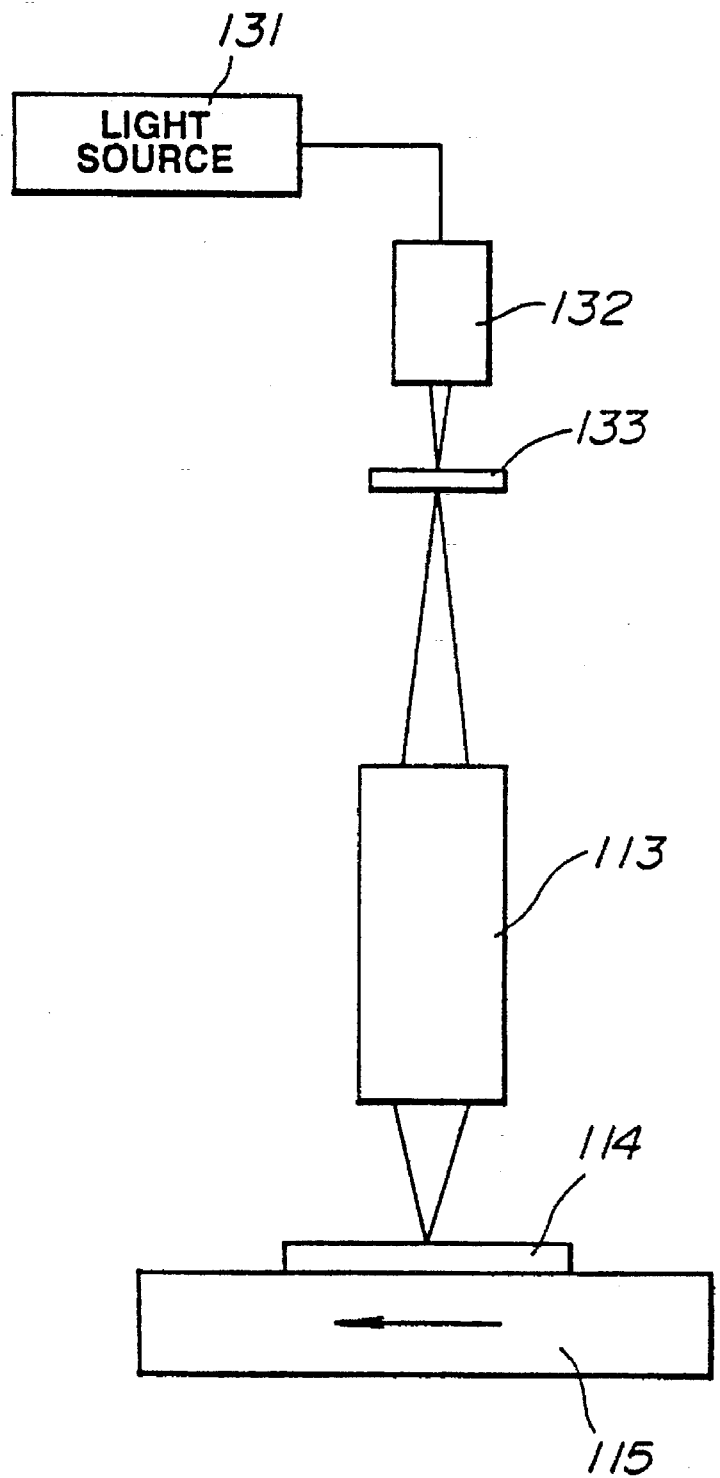
FIG. 1 is a block diagram showing a schematic arrangement of a conventional semiconductor exposure device.

The device for evaluating lens characteristics according to the present invention may be easily implemented by substituting the detection optical system made up of the converging lens, half-mirror 12 and the photodetector 16 for the illuminating optical system 132 in the semiconductor exposure device shown in FIG. 1. On the other hand, the movement of the photoresist layer 114 may be produced without raising the cost by utilizing the movement mechanism of the XY stage 115 of the exposure system.

The basic principle and construction and the concrete construction of the exposure light source 10 of the evaluating device of the present invention will be explained with reference to FIG. 4 and 5 and with reference to FIG. 6, respectively.

Figure 4:
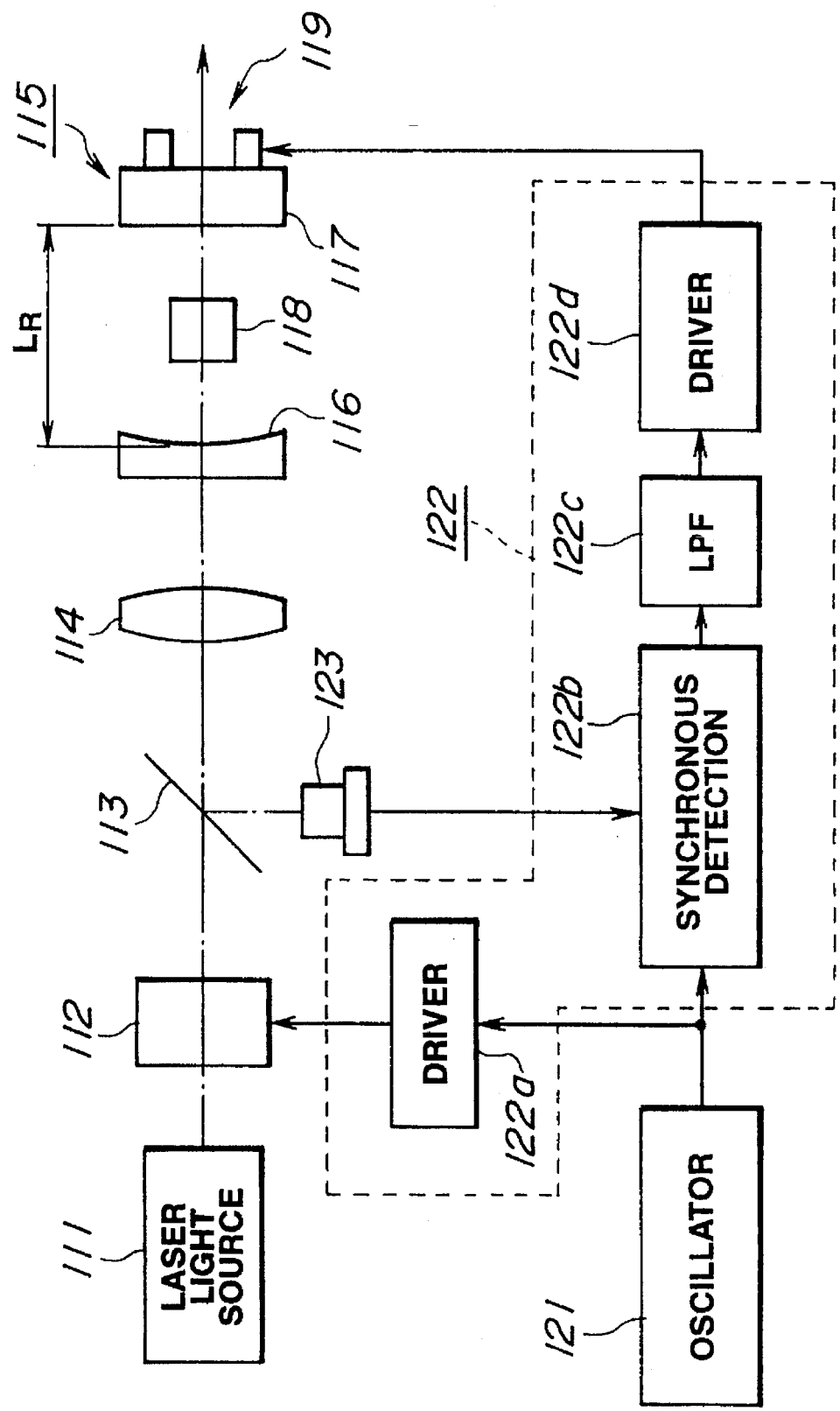
FIG. 4 illustrates the basic principle of generating an ultraviolet laser employed in the evaluating device of the present invention.

A laser light source 111 shown in FIG. 4 is constituted by a second harmonics generating laser light source (SHG laser light source) as later explained, and radiates the basic wave laser light. The basic wave laser light is phase-modulated by a phase modulator 112 employing an electro-optical (EO) device or an audio-optical (AO) device so as to be incident on an external resonator 115 via a reflecting surface 113 for detecting the light reflected by the resonator and a light-collecting lens 114. The external resonator 115 is comprised of a non-linear optical crystal device 118 arranged between a concave reflective surface 116 of a concave mirror 116 and a planar reflective surface of a plane mirror 117. The external oscillator 115 is excited into resonant oscillation when the optical path length $L_R$ between the reflective surfaces 116, 117 of the resonator 115 is of a pre-set length and the phase difference of the optical path $\Delta$ become an integer number multiple of $2\pi$, with the reflectance and the phase of reflection being acutely changed in the vicinity of the phase of resonant oscillation. At least one Of the reflective surfaces 116, 117 of the resonator 115, for example, the reflective surface 117, is driven along the optical axis by an electro-magnetic actuator 119.

If the SHG laser light source is employed as the laser light source 111, and the single mode laser beam is generated and introduced to the external resonator 115, barium borate (BBO), for example, is used for a non-liner optical crystal device 118 within the resonator 115, and the laser beam which represents second harmonics with respect to the incident light is generated under the non-linear optical effects of BBO. The laser beam represents fourth harmonics if the incident light is the SHG laser. The reflective surface 116 of the concave mirror 115 of the external resonator 115 reflects substantially all of the incident laser light, while the reflective surface 117 of the plane mirror is a dichroic mirror reflecting substantially all of the incident light and transmitting substantially all of the outgoing light reduced in wavelength to one-half of the wavelength of the incident light.

An oscillator 121 outputs a modulated signal for driving the optical phase modulator 112. The modulated signal is routed via a driver (driving circuit) 122a to the phase modulator 112. The reflected light (return light) of the laser beam supplied to the resonator 115 is detected via the reflective surface 113 by a photodetector 123, such as a photodiode, a detection signal of which is supplied to a synchronous detector 122b, to which the modulated signal from the oscillator 121 is also supplied after wave-shaping and phase-delay as the occasions may require. The modulated signal is multiplied by the detection signal of the reflected light for performing synchronous detection. An output detection signal from the synchronous detecting circuit 122b is passed through a low-pass filer (LPF) 122c so as to become an error signal for the optical path length of the resonator. This error signal is routed to a driver 122d, a driving signal which drives the actuator 119 for shifting the reflective surface 117 along the optical path by way of performing servo control of reducing the error signal to zero, thereby controlling the optical path length $L_R$ of the external resonator 115 to a length corresponding to the locally maximum point of reflectance (resonant point).

The electro-magnetic actuator 119 may be designed as a voice coil driven type actuator, with which the duplex resonant frequency may be adjusted to tens of kHz to one hundred kHz or higher. By such increase in the resonant frequency and decrease in phase differences, the cut-off frequency of the servo range may be enlarged and the driving current may be reduced to simplify the circuit construction. Thus a system in which changes in the resonator length $L_R$ of the external resonator 115 may be stably suppressed to $\frac{1}{1000}$ to $\frac{1}{10000}$ of the wavelength, that is to less than 1 Å, may be constructed inexpensively.

The external resonator 115, which is a so-called Fabry-Perot resonator, is in resonant oscillation when the optical path phase difference $\Delta$ is equal to an integer number multiple of $2\pi$, and is changed significantly in reflective phase in the vicinity of the phase of resonance. As disclosed in "Laser Phase and Frequency Stabilization Using an Optical Resonator", by R. W. Drever et al, Applied Physics B 31.97–105 (1983), frequency control of the resonator may be performed by taking advantage of such phase change. It is this technique that is utilized in the external oscillator 115.

Figure 5:
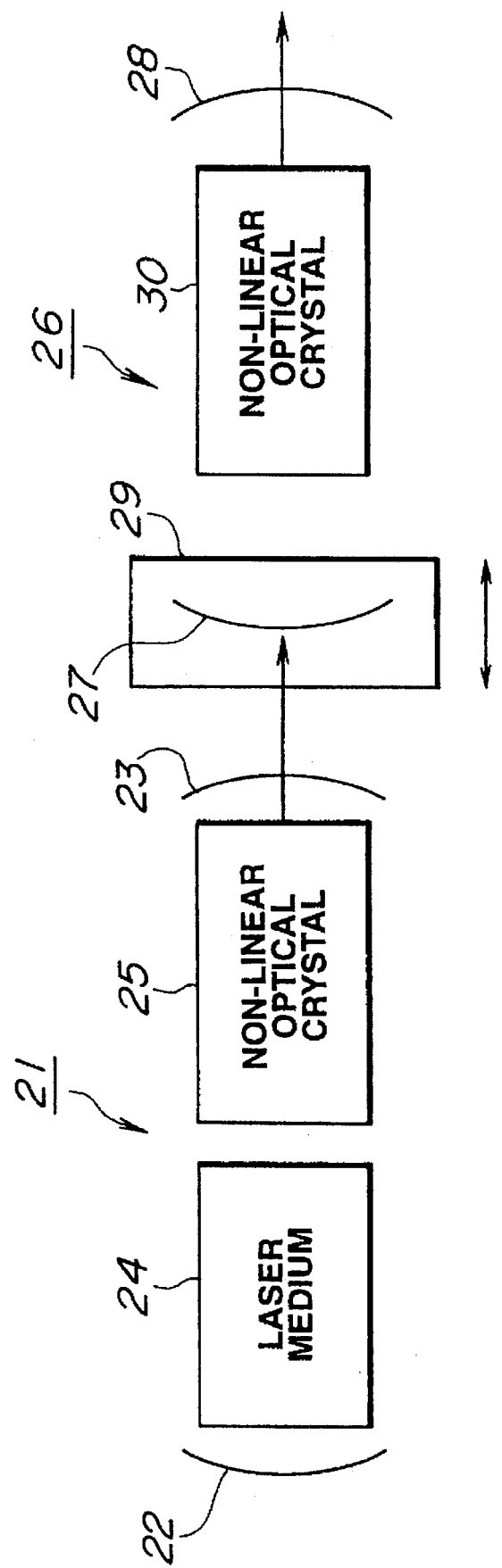
FIG. 5 is a block diagram showing a basic arrangement for generating fourth harmonics in case of employing an SHG laser.

Since an ultraviolet light of a shorter wavelength is required in the lens evaluating device of the present invention, an arrangement shown in FIG. 5 is employed as a laser light source. Such laser light source 21 is a SHG laser oscillator.

Figure 6:
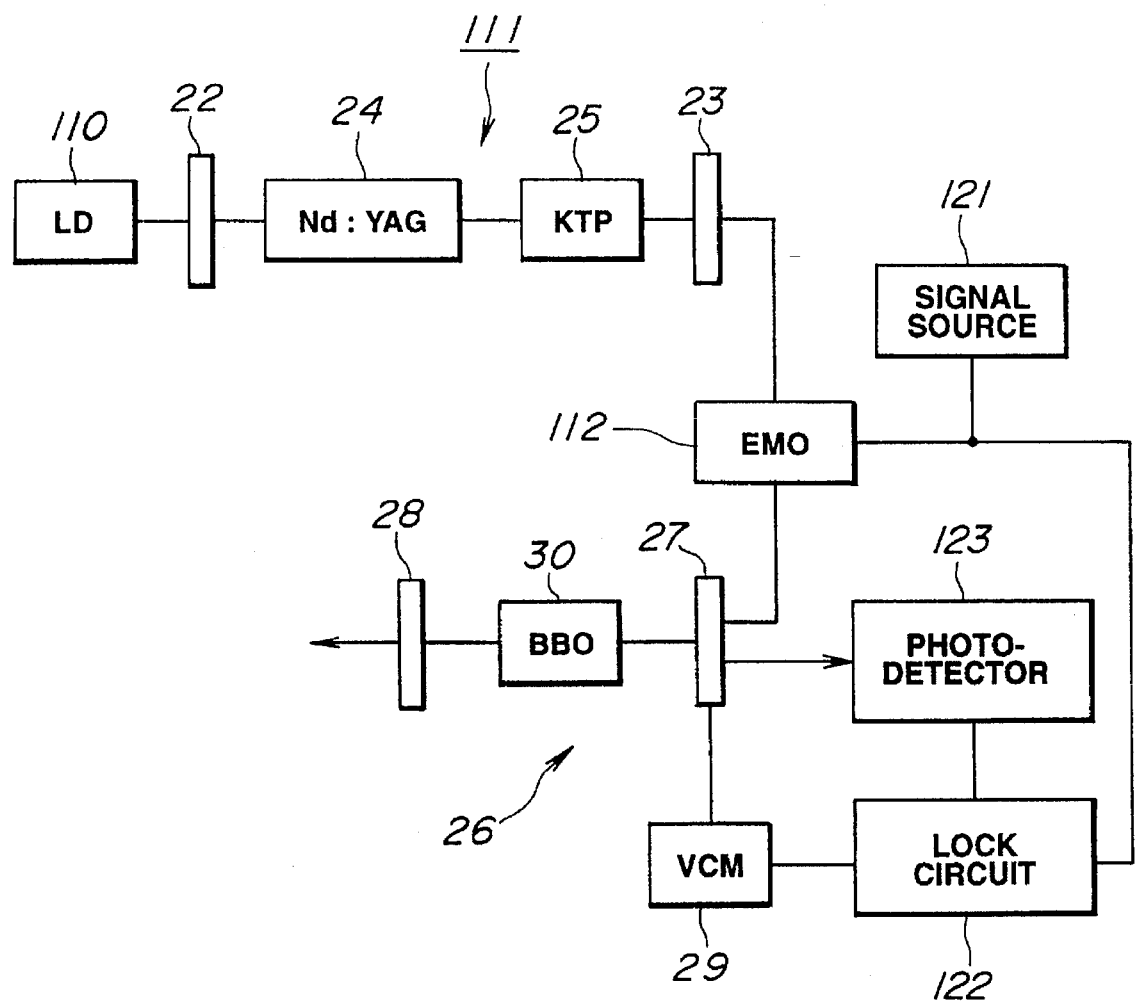
FIG. 6 is a block circuit diagram showing a schematic arrangement of an ultraviolet laser light source radiating section of the evaluating device of the present invention.

The laser light source 111 of the ultraviolet laser light radiating unit 10 is comprised of a laser medium 24, such as Nd:YAG, and a non-linear optical crystal device 25, such as KTP (KTiOP$_4$), between a pair of reflective surfaces 22 and 23 of the resonator 21, as shown in FIG. 6. The basic wave laser of a wavelength from the laser medium 24 is passed through the non-linear optical crystal device 25 and driven into resonant oscillations for generating the SHG laser light which is routed to an external resonator 26. One of the reflective surfaces 27, 28 of the external resonator 26, for example, the reflective surface 27, is driven along the optical axis by the electro-magnetic actuator 29. From a non-linear optical crystal device 30, such as BBO, enclosed in the external resonator 26, a laser light beam which represents second harmonics of the incident laser light, that is fourth harmonics of the original basic laser light beam, is produced and taken out at the external resonator 26.

By way of a concrete example, the ultraviolet laser light radiating unit 10 is constructed as shown for example in FIG. 6, in which parts or components common to those shown in FIGS. 4 and 5 are correspondingly numbered and not specifically explained and specific numerical values are given for the laser wavelength and so forth.

A laser diode 110, a semiconductor laser, transmits a laser beam of a wavelength of 810 nm, to the laser light source 111 which employs a laser medium Nd:YAG and causes the basic wave laser light with the wavelength of 1064 nm to be oscillated in resonance at the KTP 25 to output second harmonics having a wavelength of 532 nm equal to one-half the above-mentioned wavelength to an electro-optical modulator (EOM) 112. The laser beam of a frequency $f_c$ of the laser light source 111, such as on the order of 500 to 600 THz, is phase-modulated by a phase modulator 112 with a frequency $f_m$, such as 10 MHz, and a side band $f_c \pm f_m$ is set. The phase-modulated carrier frequency signal is supplied from the signal source (oscillator) 121.

The return light from the external resonator 26, having the resonant frequency $f_0$, is routed to the photodetector 123 where changes in the optical path length of the resonator are detected by the photodetector 123 by the FM sideband method detecting the beat between the frequency $f_c$ and $f_c \pm f_m$ in order to detect a position error detection signal having a polarity corresponding to the minimum reflectance position of the resonator. The reflective surface 27 is moved along the optical axis by a voice coil motor 29 of the of the electro-magnetic actuator until the position error difference signal is reduced to zero. For achieving high-precision position error detection, the error signal is taken out by a lock circuit 122 made up of the synchronous detector 122b, LPF 122c and the drivers 122a, 122d, as shown in FIG. 2.

By controlling the optical path length to $L_R$ so that the error signal is reduced to zero, and outputting the result via the BBO 30 in the external resonator 26, the second harmonics are converted into fourth harmonics, that is a laser light of an ultraviolet wavelength, which is outputted at a dichroic mirror 28.

The laser medium is not limited to Nd:YAG and Nd:YVO$_4$, Nd:BEL or LNP may also be employed. The non-linear optical crystal device may be exemplified by LN, QPN, LN, LBO or KN, in addition to KTP and BBO.

With the above-described arrangement, the outgoing light employed as a light source is extremely high in coherence, and is of the single transverse mode, so that an ideal point light source may be produced. Since the OTF of the lens under inspection may be may be inspected at the time of evaluating lens characteristics without employing the projection exposure process for printing the photoresist, the measurement process may be simplified and accurate results of evaluation may be obtained in a short time. Since calculations of the exposure distribution based on sensitivity characteristics of the resist, as required with the conventional practice, are not made, the results may be error-free. Since the OTF of the exposure lens may be inspected without the light exposure process, the difficulty of the correct pattern not being formed due to problems other than those related with the lens may be eliminated from the measurement process, thus making it possible to comprehend the performance of the lens itself.

The device for evaluating lens characteristics according to the present invention is not limited to the projection exposure device employing the reflective optical system described above, but may also be applied to a reflective optical system or to a proximity exposure device.

What is claimed is:

1. A device for evaluating a lens comprising light source means for generating fourth harmonics of the basic wave of a solid state laser, a lens for collecting and converging a laser light from said light source means to a point light source, a characteristics evaluating pattern formed on a photoresist surface of a semiconductor wafer, movement means for moving said characteristics evaluating pattern on said semiconductor wafer relative to said converging lens, detection means for detecting changes in intensity of the light reflected via a lens under evaluation from the photoresist surface having said characteristics evaluating pattern formed thereon, said characteristics evaluating pattern being scanned by the operation of said movement means, and analysis means for executing frequency analysis of the detected results from said detection means for measuring the optical transfer function, wherein said fourth harmonics outgoing from said light source means are transmitted through said lens under evaluation so as to form an image on said characteristics evaluating pattern formed on the photoresist surface of the semiconductor wafer for evaluating the lens under evaluation.

2. A device for evaluating a lens comprising an exposure light source, a converging lens for converging a light beam radiated from said exposure light source at a point, a characteristics evaluating pattern onto which the light beam outputted from said converging lens is converged by the lens under evaluation to form an image thereon, detection means for receiving a return light beam having scanned said characteristics evaluating pattern via said lens under evaluation for detecting changes in reflection intensity of the return light beam, and analysis means for executing frequency analysis of the detected results from said detection means for measuring the optical transfer function, wherein said exposure light source includes a first resonator and a second resonator, said first resonator having a laser medium illuminated by an excited light radiated by an exciting light source and a first non-linear optical crystal device for wavelength-converting the light beam radiated from said laser medium, said second resonator having a second non-linear optical crystal device for wavelength converting a light beam radiated from said first resonator.

3. A device for evaluating a lens comprising an exposure light source, a converging lens for converging a light beam radiated from said exposure light source at a point, a characteristics evaluating pattern onto which the light beam outputted from said converging lens is converged by the lens under evaluation to form an image thereon, detection means for receiving a return light beam having scanned said characteristics evaluating pattern via said lens under evaluation for detecting changes in reflection intensity of the return light beam, and analysis means for executing frequency analysis of the detected results from said detection means for measuring the optical transfer function, wherein said exposure light source includes a first resonator and a second resonator, said first resonator having a laser medium illuminated by an excited light radiated by an exciting light source and a first non-linear optical crystal device for wavelength-converting the light beam radiated from said laser medium, said second resonator having a second non-linear optical crystal device for wavelength converting a light beam radiated from said first resonator.

* * * * *